United States Patent
Kim et al.

(10) Patent No.: US 9,275,889 B2
(45) Date of Patent: Mar. 1, 2016

(54) METHOD AND APPARATUS FOR HIGH YIELD CONTACT INTEGRATION SCHEME

(71) Applicant: GLOBALFOUNDRIES Inc., Grand Cayman (KY)

(72) Inventors: Ryan Kim, Albany, NY (US); Jason R. Cantone, Mechanicville, NY (US); Wenhui Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/045,340

(22) Filed: Oct. 3, 2013

(65) Prior Publication Data

US 2015/0097263 A1 Apr. 9, 2015

(51) Int. Cl.
| | |
|---|---|
| *H01L 21/4763* | (2006.01) |
| *H01L 21/74* | (2006.01) |
| *H01L 27/11* | (2006.01) |
| *H01L 21/8234* | (2006.01) |
| *H01L 27/02* | (2006.01) |

(52) U.S. Cl.
CPC ...... *H01L 21/743* (2013.01); *H01L 21/823475* (2013.01); *H01L 21/823481* (2013.01); *H01L 27/0207* (2013.01); *H01L 27/11* (2013.01)

(58) Field of Classification Search
CPC .......................... H01L 21/0274; H01L 21/743
USPC .......................................................... 438/632
See application file for complete search history.

(56) References Cited

U.S. PATENT DOCUMENTS

| | | | |
|---|---|---|---|
| 6,265,306 B1 * | 7/2001 | Starnes et al. ................ | 438/632 |
| 2013/0034962 A1 * | 2/2013 | Yu ................................ | 438/696 |
| 2013/0196477 A1 * | 8/2013 | Kang ........................... | 438/270 |

* cited by examiner

*Primary Examiner* — Ajay K Arora
(74) *Attorney, Agent, or Firm* — Ditthavong & Steiner, P.C.

(57) ABSTRACT

A methodology for forming contact areas by a multiple patterning process that provides increased yield and lower risk of contact-to-contact short at points of tight tip-to-tip spacing and the resulting device are disclosed. Embodiments include forming one or more trench patterning layers on a planarized surface of a wafer, forming one or more trenches in the one or more trench patterning layers, forming a block mask at one or more points along the one or more trenches, extending the one or more trenches down to a substrate level of the wafer, and removing the block mask from the one or more points.

9 Claims, 6 Drawing Sheets

METHOD AND APPARATUS FOR HIGH YIELD CONTACT INTEGRATION SCHEME

TECHNICAL FIELD

The present disclosure relates to a semiconductor contact integration scheme. The present disclosure is particularly applicable to static random access memory (SRAM) design for 20 nanometer (nm) and beyond technology nodes.

BACKGROUND

Due to the high resource requirements of extreme ultraviolet (EUV) lithography, 193 nm immersion lithography remains an attractive alternative for the fabrication of 20 nm and beyond technology nodes. However, 193 nm immersion lithography techniques suffer from reliability and yield issues caused by time dependent dielectric breakdown (TDDB), especially for tight contact tip-to-tip spacing. The problems caused by tight tip-to-tip contact spacing are particularly severe in highly integrated circuits with the greatest demands for feature size reduction and scaling (e.g., 10 nm SRAM design).

FIG. 1 illustrates a top view 100 of contact trenches 101 and gates 103. Due to the tight contact to gate pitch (CGP) 105, a triple patterning process (e.g., with 193 nm immersion lithography) is used to pattern the contact trenches 101 alongside the gates 103. Despite the high resolution of the triple patterning process, shorts may still occur in tight tip-to-tip contact spacings. For example, the tip-to-tip spacing near gate contacts 109 may be particularly small. Furthermore, process optimization for triple patterning is particularly expensive and resource-intensive because of the unknown variation of the tools at these feature sizes. For example, product overlay does not scale at the same rate as the rate at which chip features are down-scaled. The integration margin for 20 nm nodes is, therefore, not as great as it is for less advanced technology nodes. In addition, mask error remains a problem and further complicates the contact integration process. For example, the risk of contact-to-contact shorts is greater for end-of-line process stages because of the greater mask error enhancement factor (MEEF).

A need therefore exists for a methodology enabling less costly middle-of-line (MOL) contact integration with improved yield and reliability, and the resulting device.

SUMMARY

An aspect of the present disclosure is a method of patterning contacts for a MOL integration stack that results in greatly reduced risk of contact-to-contact shorts and TDDB.

Another aspect of the present disclosure is a contact area of a semiconductor device exhibiting greatly reduced risk of contact-to-contact shorts and TDDB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming one or more trench patterning layers on a planarized surface of a wafer, forming one or more trenches in the one or more trench patterning layers, forming a block mask at one or more points along the one or more trenches, extending the one or more trenches down to a substrate level of the wafer, and removing the block mask from the one or more points.

Aspects of the present disclosure include forming the one or more trenches according to a double patterning process. Additional aspects include the one or more points are associated with a tight tip-to-tip contact spacing parameter. Further aspects include determining the one or more points along the trench associated with a tight tip-to-tip contact spacing parameter. Additional aspects include extending the one or more trenches down to one or more contact areas of one or more semiconductor devices formed on the wafer. Further aspects include forming a first dielectric material between one or more semiconductor devices on the wafer, planarizing the wafer down to the one or more semiconductor devices, forming a first trench patterning layer on the planarized wafer surface, and forming a second trench patterning layer on the first trench patterning layer. Additional aspects include forming the first trench patterning layer of a dielectric material to a thickness greater than 10 nm and forming the second trench patterning layer of silicon nitride (SiN), silicon dioxide (SiO$_2$), titanium (Ti) or silicon carbide (SiC) to a thickness greater than 10 nm. Further aspects include a critical dimension of the block mask corresponds to a tip-to-tip contact spacing. Additional aspects include a critical dimension of the block mask is 10 nm to 150 nm. Further aspects include the block mask includes photoresist, SiN, or titanium nitride (TiN). Further aspects include defining one or more large contact-to-contact spacings when forming the one or more first and second trenches.

Another aspect of the present disclosure is a device including: a wafer, one or more semiconductor devices including source/drain regions on the wafer, a dielectric material between the one or more semiconductor devices, and one or more contact areas, through the dielectric material, having a tight tip-to-tip contact spacing, wherein the contact areas are formed by forming one or more trench patterning layers on a planarized surface of the wafer, forming one or more trenches in the one or more trench patterning layers, forming a block mask at one or more points along the one or more trenches, extending the one or more trenches down to the source/drain regions, removing the block mask from the one or more points, wherein the tip-to-tip contact spacing corresponds to a critical dimension of the block mask. Additional aspects include the critical dimension of the block mask is 10 nm to 150 nm. Further aspects include the block mask comprises photoresist, SiN, or TiN.

Aspects include a method including: forming one or more trench patterning layers on a planarized surface of a wafer, forming one or more first trenches in the one or more trench patterning layers, forming one or more second trenches in the one or more trench patterning layers, determining one or more points along the one or more first and second trenches associated with a tight tip-to-tip contact spacing parameter, forming a block mask at the one or more points, extending the one or more first and second trenches down to a substrate level of the wafer, and removing the block mask from the one or more points.

Other aspects include forming the one or more first and second trenches in the one or more trench patterning layers according to a self-aligned double patterning process. Additional aspects include extending the one or more first and second trenches down to one or more contact areas of one or more semiconductive devices on the wafer. Further aspects include a critical dimension of the block mask corresponds to a tip-to-tip contact spacing. Additional aspects include a critical dimension of the block mask is 10 nm to 150 nm. Further aspects include defining one or more large contact-to-contact spacings when forming the one or more first and second trenches.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A-1 through 2E-1 schematically illustrate top views of a contact integration scheme, in accordance with an exemplary embodiment; and FIGS. 2A-2 through 2E-2 schematically illustrate cross section views of a contact integration scheme, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of contact-to-contact shorts attendant upon tight tip-to-tip spacing in advanced technology nodes. In accordance with embodiments of the present disclosure, a block mask is used to define the tip-to-tip spacing.

Methodology in accordance with embodiments of the present disclosure includes forming one or more trench patterning layers on a planarized surface of a wafer, forming one or more trenches in the one or more trench patterning layers, forming a block mask at one or more points along the one or more trenches, extending the one or more trenches down to a substrate level of the wafer, and removing the block mask from the one or more points.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2E schematically illustrate a contact integration scheme, in accordance with an exemplary embodiment of the present disclosure.

Figure 1:
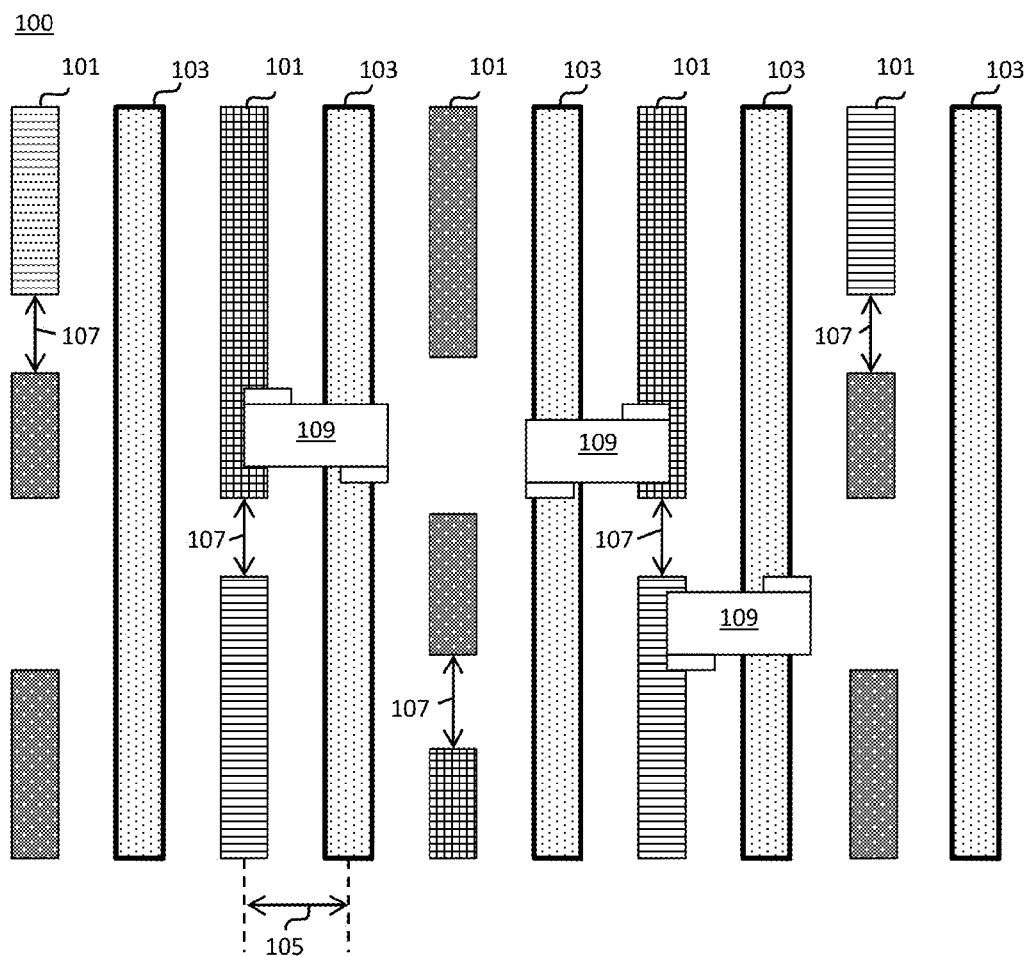
FIG. 1 schematically illustrates a top view of a semiconductor wafer patterned according to a conventional contact integration scheme.
Figures 1, 2A:
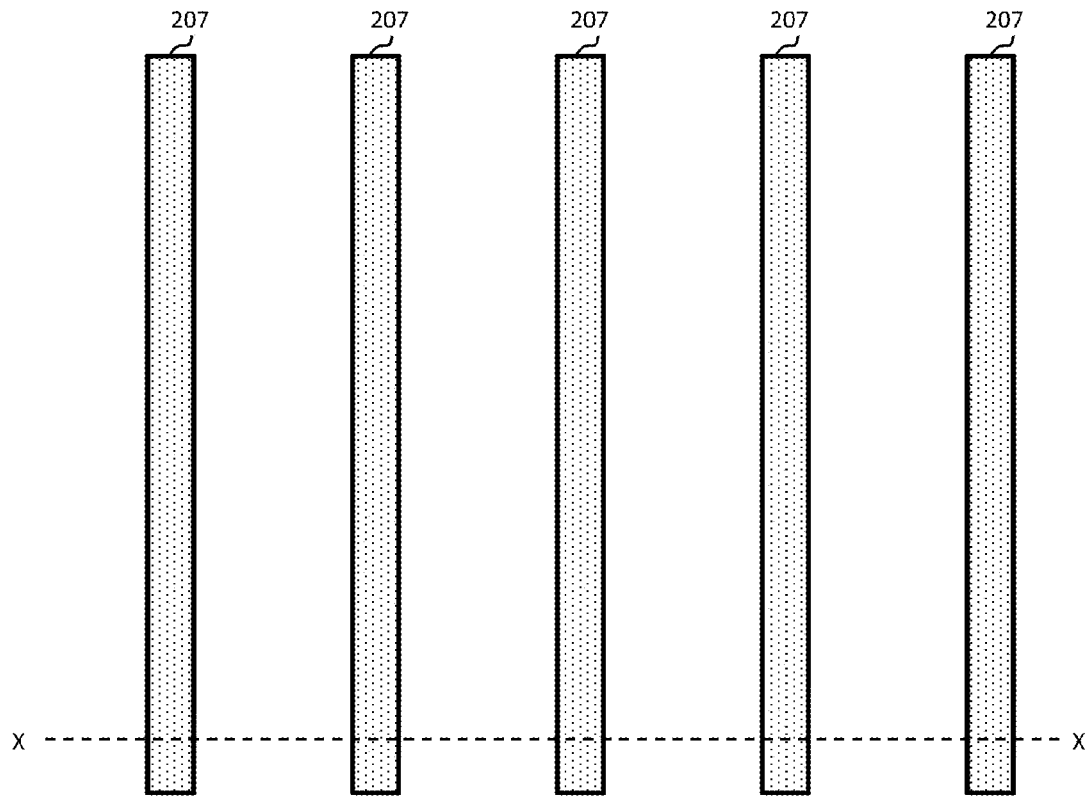
Figures 2, 2A:
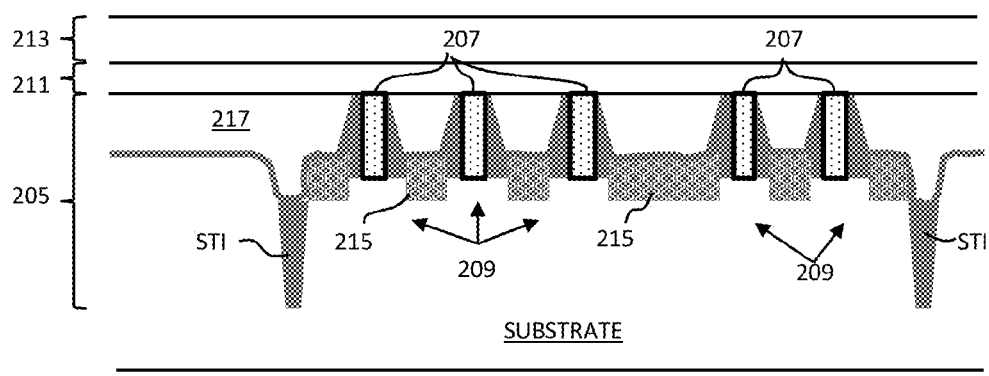

FIGS. 2A-1 and 2A-2 illustrate respective top (201) and cross-sectional (203) views of a MOL integration stack 205. The areas 207 in the top view 201 correspond to gates 207 of the semiconductor devices 209 in the cross section view 203. As shown in FIG. 2A-2, the semiconductor devices 209 are beneath a first trench patterning layer 211 and a second trench patterning layer 213. The first trench patterning layer 211 may also be referred to as an inter-layer dielectric (ILD) layer and may have a thickness greater than 10 nm. The second trench patterning layer 213 may, for example, be formed from SiN, $SiO_2$, Ti, or silicon carbide (SiC) and has a thickness greater than 10 nm. As shown, the semiconductor devices 209 may have shared source/drain regions (e.g., shared source/drain 215). The material 217 deposited between the semiconductor devices 209 and above the substrate may be any dielectric material or another ILD material. As further shown, shallow trench isolation (STI) regions may be present for device isolation.

Figures 1, 2B:
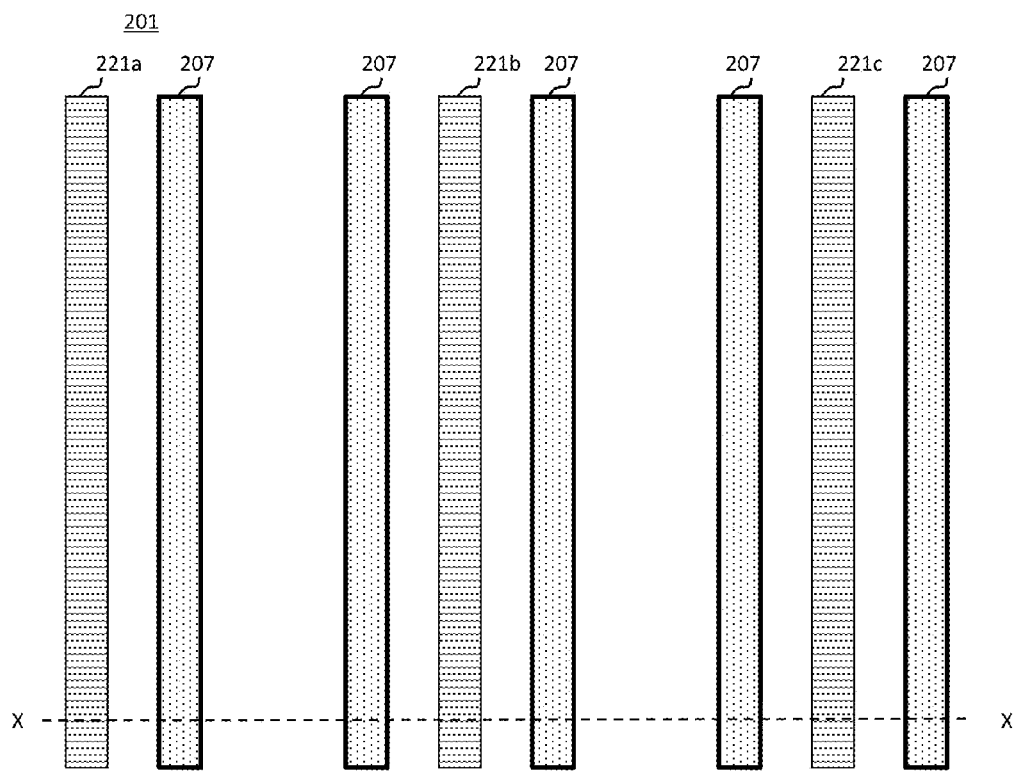
Figures 2, 2B:
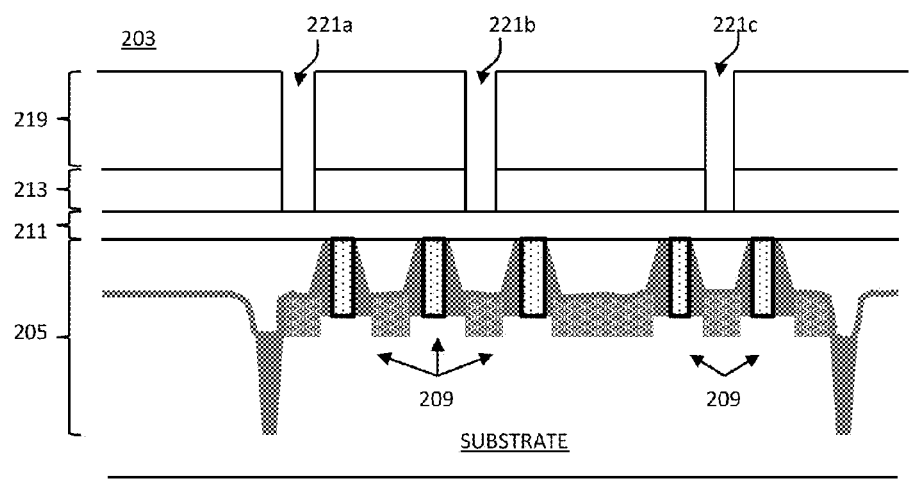

FIGS. 2B-1 and 2B-2 illustrate respective top (201) and cross-sectional (203) views of the MOL integration stack 205 following a first patterning step. As shown in FIG. 2B-2, a photoresist layer 219 was formed on the second trench patterning layer 213 and was etched down to the first trench patterning layer 211 to form contact trenches 221a-221c (collectively referred to as contact trenches 221). As shown in FIG. 2B-1, the contact trenches 221 are formed alongside the gates 207.

Figures 1, 2C:
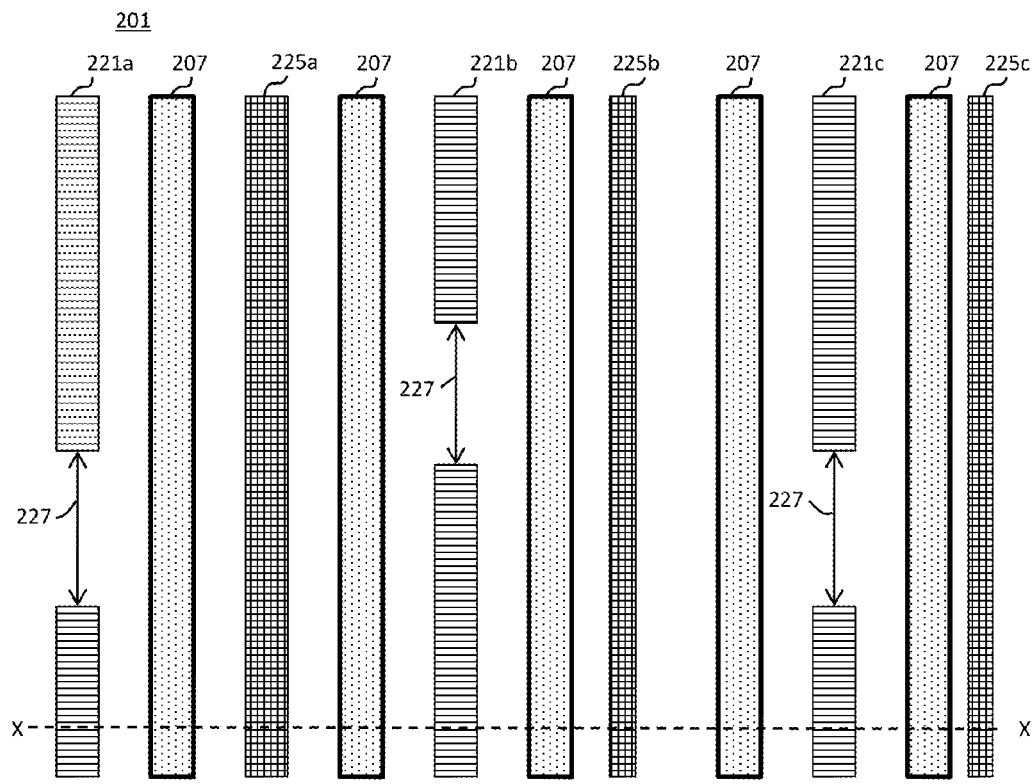
Figures 2, 2C:
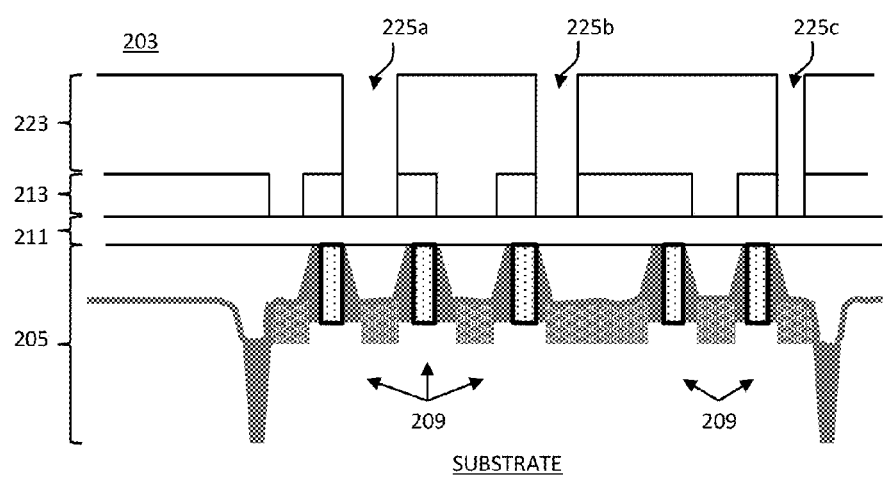

FIGS. 2C-1 and 2C-2 illustrate respective top (201) and cross-sectional (203) views of the MOL integration stack 205 following a second patterning step. A second photoresist layer 223 was formed on the etched second trench patterning layer 213 and was patterned to further etch the second trench patterning layer 213 at contact trenches 225a-225c (collectively referred as contact trenches 225). As shown in FIG. 2C-1, the contact trenches 225 are formed alongside the gates 207. The second patterning step does not etch at points 227 that have a large contact-to-contact spacing.

The first and second patterning steps may be performed according to a lithography-etch-lithography-etch (LELE) double patterning process. For example, the contact trenches 221 formed in the first patterning step and the contact trenches 225 formed in the second patterning step may correspond to two successive lithography-etch cycles in a LELE double patterning process.

Figures 1, 2D:
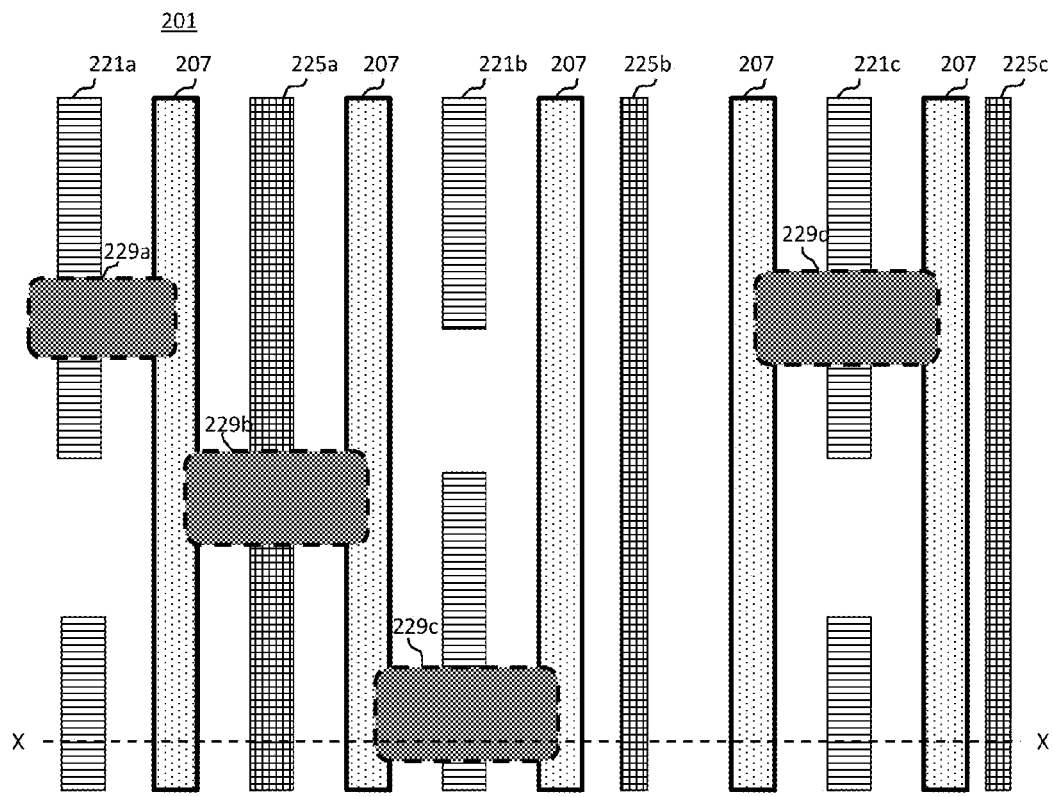
Figures 2, 2D:
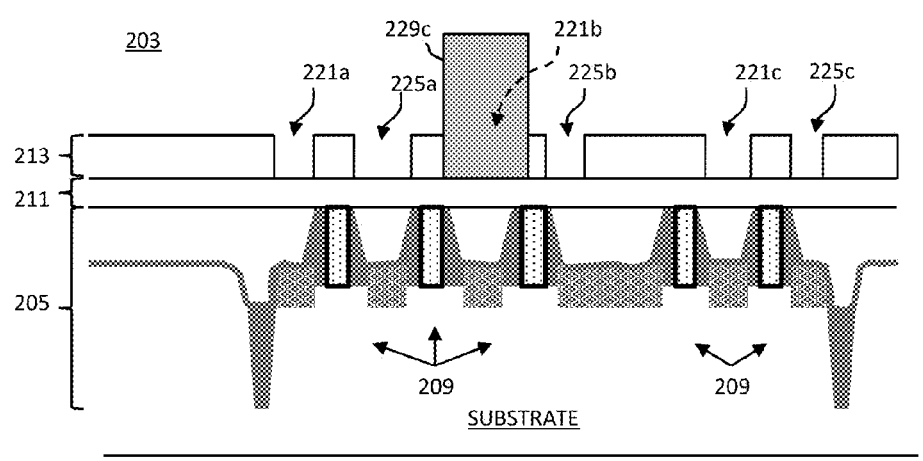

FIGS. 2D-1 and 2D-2 illustrate respective top (201) and cross-sectional (203) views of the MOL integration stack 205 after removal of the second photoresist layer 223 and formation of block masks 229a-229d (collectively referred to as block masks 229) at tight contact-to-contact spacing points. As used herein, the term "tight" may be used to refer to any tip-to-tip spacing that is greater than or equal to 10 nm and less than or equal to 150 nm. As shown in the top view 201, the critical dimension of the block masks 229 corresponds to the required contact-to-contact spacing at the tight contact-to-contact spacing points. As shown in the cross section view 203, the block mask 229c masks the contact trench 221b formed in the first patterning step. The block mask may be formed to a height of 40 nm or greater and may be formed from photoresist, SiN, or TiN.

Figures 1, 2E:
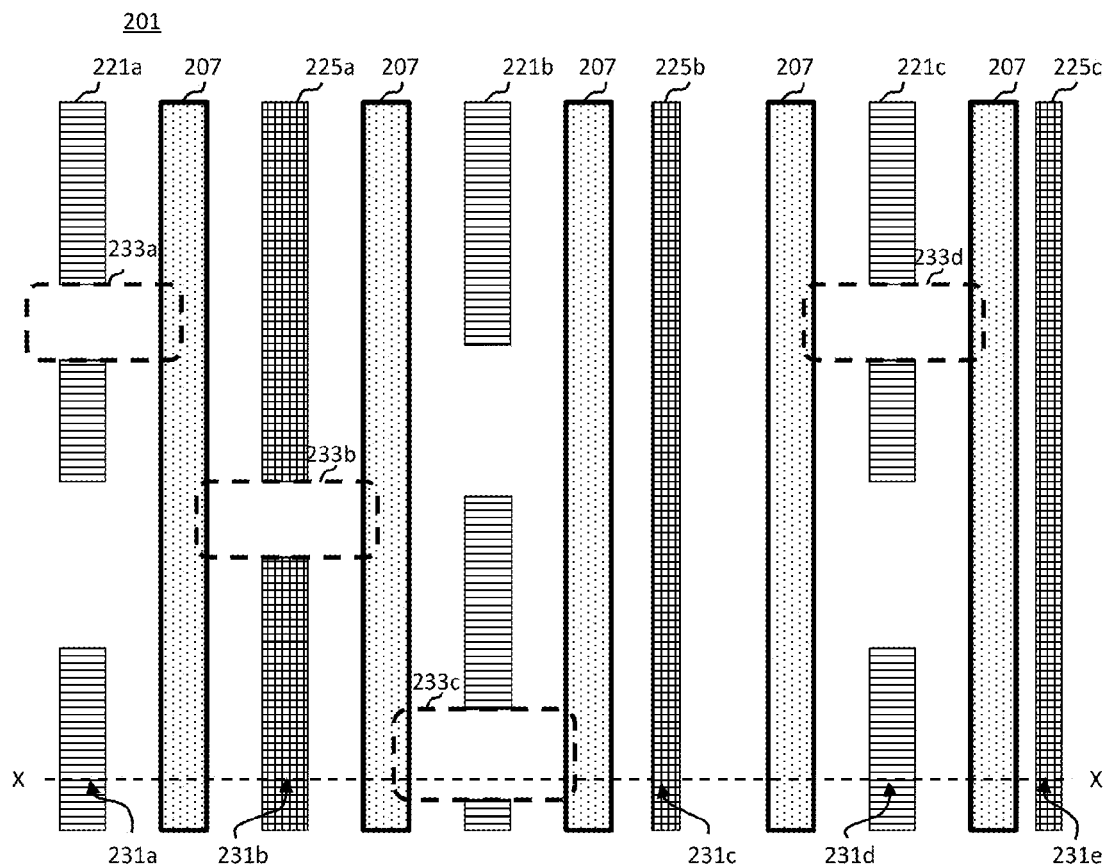
Figures 2, 2E:
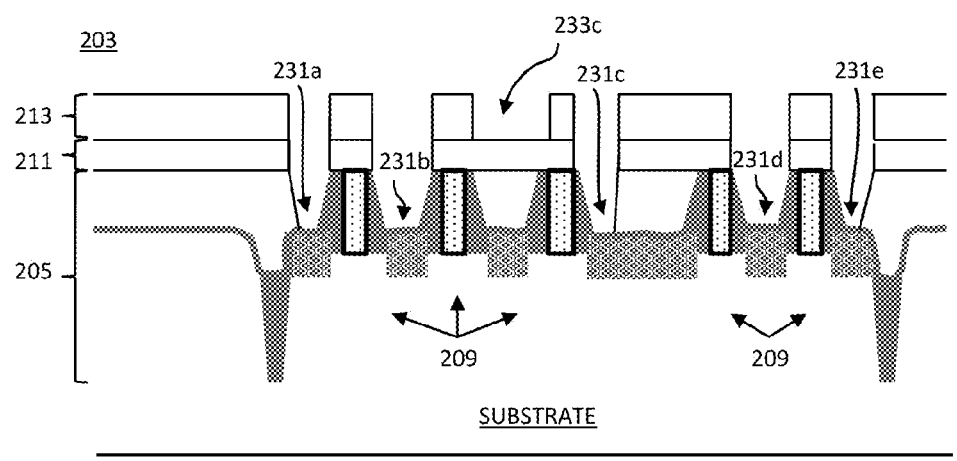

FIGS. 2E-1 and 2E-2 illustrate respective top (201) and cross-sectional (203) views of the MOL integration stack 205 after the contact trenches 221 and 225 (as shown in FIG. 2D-2) have been etched through the first trench patterning layer 211 down to the contact areas 231a-231e (collectively referred to as contact areas 231) of the semiconductor devices 209 and the block masks 229 have been removed. As illustrated in FIG. 2E-1, the contact-to-contact spacing at the tight contact-to-contact spacing points 233a-233d correspond to the critical dimensions of the block masks 229 that were used to mask these points (as indicated by the dashed lines). As shown in the cross section view 203, the first trench patterning layer 211 has not been etched in the tight contact-to-contact spacing point 233c corresponding to the location of the contact trench 221b) because of the block masking.

The embodiments of the present disclosure can achieve several technical effects, including reduced risk of contact-to-contact short at points with tight tip-to-tip spacing, reduced risk of time dependent dielectric breakdown, as well as increased yield. The present disclosure enjoys industrial applicability in fabricating any of various types of highly integrated semiconductor devices, particularly for 20 nm and beyond technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming one or more trench patterning layers on a planarized surface of a wafer;
   forming one or more trenches in the one or more trench patterning layers;
   forming a block mask at one or more points along the one or more trenches;
   extending the one or more trenches down to one or more source/drain regions of one or more semiconductor devices formed on the wafer; and
   removing the block mask from the one or more points,
   wherein a critical dimension of the block mask is 10 nanometers (nm) to 150 nm, and
   the critical dimension of the block mask corresponds to a tip-to-tip contact spacing.

2. The method according to claim 1, comprising forming the one or more trenches according to a double patterning process.

3. The method according to claim 1, further comprising:
   forming a first dielectric material between one or more semiconductor devices on the wafer;
   planarizing the wafer down to the one or more semiconductor devices;
   forming a first trench patterning layer on the planarized wafer surface; and
   forming a second trench patterning layer on the first trench patterning layer.

4. The method according to claim 3, comprising forming the first trench patterning layer of a dielectric material to a thickness greater than 10 nanometers (nm) and forming the second trench patterning layer of silicon nitride (SiN), silicon dioxide ($SiO_2$), titanium (Ti) or silicon carbide (SiC) to a thickness greater than 10 nm.

5. The method according to claim 1, wherein the block mask comprises photoresist, SiN, titanium nitride (TiN), or a combination thereof.

6. The method according to claim 1, further comprising:
   defining one or more contact-to-contact spacings when forming the one or more trenches.

7. A method comprising:
   forming one or more trench patterning layers on a planarized surface of a wafer;
   forming one or more first trenches in the one or more trench patterning layers;
   forming one or more second trenches in the one or more trench patterning layers;
   determining one or more points along the one or more first and second trenches associated with a tight tip-to-tip contact spacing parameter;
   forming a block mask at the one or more points;
   extending the one or more trenches down to one or more source/drain regions of one or more semiconductor devices formed on the wafer; and
   removing the block mask from the one or more points,
   wherein a critical dimension of the block mask is 10 nanometers (nm) to 150 nm, and
   wherein the critical dimension of the block mask corresponds to a tip-to-tip contact spacing.

8. The method according to claim 7, comprising forming the one or more first and second trenches in the one or more trench patterning layers according to a double patterning process.

9. The method according to claim 7, further comprising:
   defining one or more contact-to-contact spacings when forming the one or more first and second trenches.

* * * * *